United States Patent [19]

Chibana

[11] 3,715,675

[45] Feb. 6, 1973

[54] VARIABLE RESISTOR DEVICE USING A FIELD TRANSISTOR

[75] Inventor: Masanobu Chibana, Hamamatsu, Japan

[73] Assignee: Nippon Gakki Siezo Kabushiki Kaisha, Hamamatsu-chi, Shizuoka-ken, Japan

[22] Filed: Sept. 8, 1971

[21] Appl. No.: 178,680

[30] Foreign Application Priority Data

Sept. 10, 1970 Japan ....................45/79112
Sept. 10, 1970 Japan ....................45/79113

[52] U.S. Cl. ....................330/28, 330/29, 330/35, 330/86

[51] Int. Cl. ....................H03g 3/30

[58] Field of Search....................330/29, 28, 35, 86, 145; 325/319

[56] References Cited

UNITED STATES PATENTS

| | | | |
|---|---|---|---|
| 3,327,236 | 6/1967 | Krossa et al. | 330/29 |
| 3,233,122 | 2/1966 | Theriault | 330/35 UX |

FOREIGN PATENTS OR APPLICATIONS

| | | | |
|---|---|---|---|
| 216,799 | 8/1958 | Austria | 330/29 |

OTHER PUBLICATIONS

Todd, "Fets As Voltage–Variable Resistors," Electronic Design Sept. 13, 1965, pp. 66–69.
Elliot, "Field Effect Transistor As A Variable Resistance" IBM Technical Disclosure Bulletin, Vol. 7, No. 1, June 1964, p. 111.

*Primary Examiner*—Roy Lake
*Assistant Examiner*—James B. Mullins
*Attorney*—R. D. Flynn et al.

[57] ABSTRACT

A variable resistor device using a field effect transistor wherein two resistors having an equal value of resistance are connected in series between the source and drain of the field effect transistor and a variable control D.C. voltage source is connected between the gate and the connection point of the two resistors to vary the resistance across the source and drain with an improved linearity. The variable resistor device is preferably adapted to be connected to an amplifier to control its gain with little distortion of A.C. signals.

6 Claims, 5 Drawing Figures

VARIABLE RESISTOR DEVICE USING A FIELD TRANSISTOR

BACKGROUND OF THE INVENTION

This invention relates to a variable resistor device and more particularly to a variable resistor device using a field effect transistor, and a variable gain amplifier employing such variable resistor device.

An automatic level control device used in various kinds of electronic circuits, a proportional (linear) gate, a sound volume control device, a circuit for generating a percussive or mandolin effect used in an electronic musical instrument includes a variable resistor device which presents varying values of resistance according to the magnitude of an impressed control voltage.

One of the variable resistor devices known to date is a type using, as shown in FIG. 1, a field effect transistor (hereinafter referred to as an FET). According to the prior art device, the resistance across the source S and drain D of the FET is adjusted by changing the voltage E of a D.C. source impressed across the gate G and source S of the FET. The variable resistor device of FIG. 1 may be used as a type wherein the resistance across the two terminals $t_1$ and $t_2$ is varied by the control voltage E.

In the so-called triode region of such variable resistor device, that is, a region where there exists a relationship of $|V_{DS}| < |V_{GS} - V_{th}|$, the drain current $I_D$ may be approximately expressed by the following equation:

$$I_D = \beta[(V_{GS} - V_{th})V_{DS} - \tfrac{1}{2} V_{DS}^2]$$

where:

$V_{DS}$ = voltage across the drain and source
$V_{GS}$ = voltage across the gate and source
$V_{th}$ = threshold voltage inherent in the FET
$\beta$ = constant inherent in the FET Therefore, the conductance $G_D$ may obviously be expressed by the following equation:

$$G_D = I_D/V_{DS} = \beta[(V_{GS} - V_{th}) - \tfrac{1}{2} V_{DS}] = f(V_{GS}, V_{DS})$$

As seen from the above equation, the conductance $G_D$ is dependent not only on the control voltage $V_{GS}$ but also on the voltage $V_{DS}$ impressed across the terminals $t_1$ and $t_2$ of a variable resistor device. Accordingly, the device presents nonlinear characteristics indicated in dotted lines in FIG. 3 with respect to the voltage $V_{DS}$ and the current $I_{DS}$, that is, displays varying resistance according to the magnitude of the voltage $V_{DS}$ impressed across the terminals $t_1$ and $t_2$, though there may be applied the same level of control voltage $V_{GS}$. When, therefore, there is impressed A.C. voltage across the terminals $t_1$ and $t_2$, there occurs a distortion. It is definitely desired that a circuit handling A.C. signals be free from any distortion that might originate with a variable resistor device used.

It is accordingly the object of this invention to provide a variable resistor device using a field effect transistor, wherein the resistance across the source and drain of the transistor is not dependent on the voltage impressed on the source and drain, but on the gate control voltage alone.

SUMMARY OF THE INVENTION

In accordance with this invention there is provided a variable resistor device comprising a field effect transistor having a source, drain and gate; two resistors connected in series between the source and drain of the field effect transistor and having an equal resistance; and a control D.C. source connected between the junction of the two resistors and the gate of the field effect transistor, thereby obtaining a variable resistance across the source and drain of the field effect transistor by changing the voltage of the D.C. source.

DESCRIPTION OF THE PREFERRED EMBODIMENTS

Figure 1:
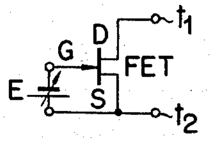
FIG. 1 is a circuit diagram of the conventional variable resistor device using a field effect transistor.
Figure 2:
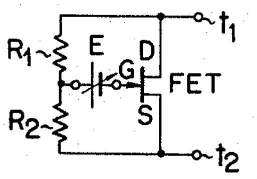
PRIOR ART FIG. 2
FIG. 2 is a circuit diagram of a variable resistor device using a field effect transistor according to this invention.

Referring to FIG. 2, in the variable resistor device of this invention, resistors $R_1$ and $R_2$ having an equal resistance are connected in series between the drain and source of the FET. Between the junction of the resistors $R_1$ and $R_2$ and the gate of the FET is connected a control power source E. Since the potential of the junction of the resistors $R_1$ and $R_2$ is exactly intermediate between the potential of the drain and that of the source, the voltage $V_{GS}$ across the gate and source of the FET is equal to $V_G + \tfrac{1}{2} V_{DS}$. Here $V_G$ denotes the voltage of the control power source E. In the variable resistor device of this invention, the drain current $I_D$ in the aforesaid triode region may be approximately expressed by the following equation:

$$I_D = \beta[(V_G + \tfrac{1}{2} V_{DS} - V_{th})V_{DS} - \tfrac{1}{2} V_{DS}^2]$$
$$= \beta[(V_G - V_{th})V_{DS} + \tfrac{1}{2} V_{DS}^2 - \tfrac{1}{2} V_{DS}^2]$$
$$= \beta[V_G - V_{th})V_{DS}]$$

Therefore the conductance $G_D$ may be expressed by the following equation:

$$G_D = I_D/V_{DS} = \beta[V_G - V_{th}] = f(V_G)$$

Figure 3:
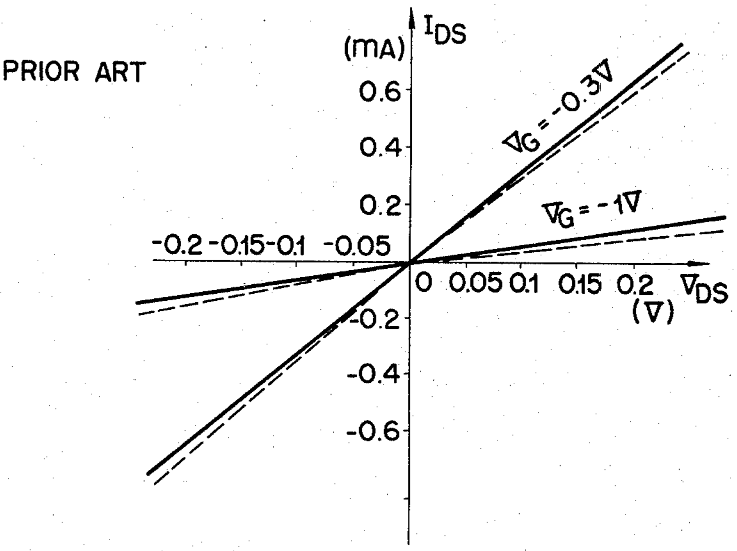
FIG. 3 indicates characteristic diagrams of a variable resistor device using a field effect transistor with respect to the voltage $V_{DS}$ across the source and drain and the drain current $I_{DS}$, dotted lines represent the device of FIG. 1 and solid lines that of FIG. 2.

Since $G_D$ can be indicated as a linear function of $V_G$ alone, the $V_{DS} - I_{DS}$ characteristics of the variable resistor device of this invention obviously display good linearity as shown in solid lines in FIG. 3. When the voltage of a control power source was varied between −0.1 and −2 volts with the resistors $R_1$ and $R_2$ of FIG. 2 set at 220, then the resistance across the terminals $t_1$ and $t_2$ was changed between 100 ohms and 100.

An amplification circuit including the aforementioned variable resistor device provides a variable gain amplifier capable of controlling an amplification factor or gain with little distortion and over a fully broad range, particularly a type well adapted for use with the circuit of an electronic musical instrument for generating a percussive or mandolin effect.

A variable gain amplifier known to date is formed by connecting a constant current circuit including an FET, transistor or fixed resistor to the emitter of, for example, an emitter grounded transistor and further connecting to the constant current circuit an FET variable impedance circuit in parallel with respect to alternating current, thereby varying the amplification factor of the aforesaid emitter grounded transistor through control of the gate voltage of the FET.

Figure 4:
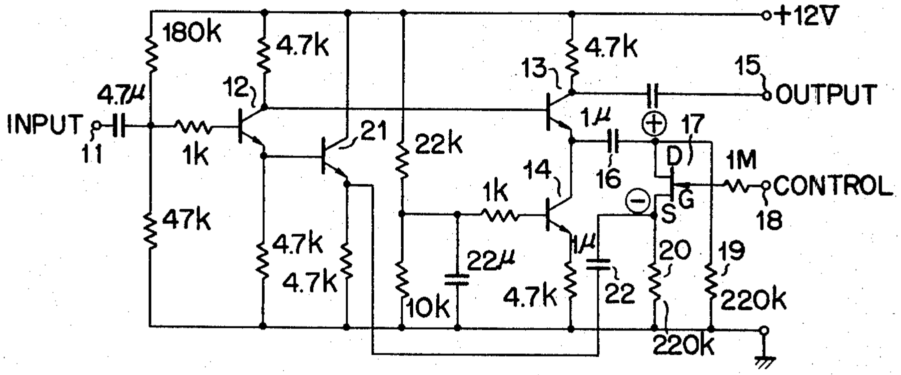
FIG. 4 is a circuit diagram of a variable gain amplifier using the variable resistor device of FIG. 2.

FIG. 4 shows a variable gain amplifier including the variable resistor device of this invention shown in FIG. 2 as a variable impedance circuit. Referring to FIG. 4, an input signal supplied to an input terminal 11 is amplified by a transistor 12, the output from the collector of which is conducted to the base of a following transistor 13 whose gain is to be controlled. This transistor 13 constitutes an emitter grounded amplifier, the emitter of which is grounded through the collector and emitter of a transistor 14 forming a constant current circuit. The output from the transistor 13 is derived from its collector and supplied to an output terminal 15. To the collector of transistor 14 constituting the aforesaid constant current circuit is connected the drain of an FET 17 through a capacitor 16 to connect an impedance circuit in parallel with the transistor with respect to alternating current. The drain of FET 17 is grounded through a resistor 19 and its source through a resistor 20 having an equal resistance thereto. The gate of the FET 17 is connected to a control terminal 18 supplied with a control voltage of a source (not shown).

The output from the emitter of transistor 12 is supplied to the base of a transistor 21 used as an impedance converter, the output from the emitter follower of the transistor 21 being conducted to the source of FET 17 through a capacitor 22.

As seen from FIG. 2 and the foregoing description, where the junction of the resistors $R_1$ and $R_2$ is grounded, the drain and source of the FET are impressed with out-of-phase (180°) signals of the same level respectively. Referring to FIG. 4, the emitter and collector of transistor 12 have the same degree of resistance, so that there are derived from the collector and emitter two signals of substantially the same level but opposite polarity. These signals are respectively conducted to the drain and source of the FET 17 through the transistors 13 and 21.

In the variable gain amplifier of the aforesaid arrangement, the amplification factor of the transistor 13 is obviously controlled with full linearity by a control D.C. voltage signal supplied from a control terminal 18, enabling gain to be varied over a full range with little distortion. For example, where a music signal is introduced from the input terminal 11 and a saw tooth wave voltage signal is supplied to the control terminal 18, then there is drawn out from the output terminal 15 a good musical signal free from distortion which is furnished with a percussive effect.

Figure 5:
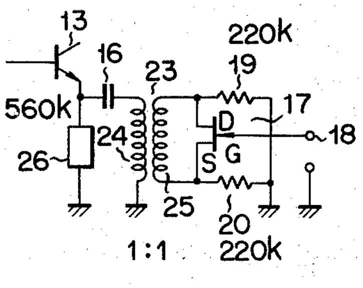
FIG. 5 is a modification of FIG. 4.

FIG. 5 represents an embodiment of this invention wherein there is used a transformer to impress the source and drain of the FET 17 with signals of opposite polarity having a substantially equal level. The emitter of transistor 13 is grounded through the capacitor 16 and the primary winding 24 of the transformer 23. To both ends of the secondary winding 25 thereof are connected the drain and source of the FET 17. In this case, the drain and source of FET 17 are impressed with signals of substantially the same level but opposite polarity. Therefore use of such transformer eliminates the necessity of providing the transistors 12 and 21 of FIG. 4.

The constant current circuit connected to the emitter of the transistor 13 may consist of a fixed resistor 26. It will be apparent that such circuit can act in the same manner as the amplifier of FIG. 4.

What is claimed is:

1. A variable gain amplifier device comprising:

an emitter grounded transistor having a base, emitter and collector, its base being connected to a source of input signals and its gain being controlled;

a constant current circuit connected to the emitter of said emitter grounded transistor;

a field effect transistor having a source, drain and gate, and connected in parallel to said constant current circuit with respect to alternating current;

a source of control D.C. voltage signals connected to the gate of said field effect transistor;

two resistors having an equal resistance and respectively connecting the source and drain of said field effect transistor to ground; and supply means for supplying the source and drain of said field effect transistor with signals from an input signal source which are of substantially the same level but opposite polarity, said supply means including a transistor producing two output signals of substantially the same level but opposite polarity upon receipt of signals from said input signal source, one of said two output signals being conducted to one of said source and drain of said field effect transistor through said emitter grounded transistor whose gain is to be controlled, and the other being supplied to the other of said source and drain of said field effect transistor.

2. A variable gain amplifier device according to claim 1 wherein said one of said two output signals of the transistor of the supply means is connected to said drain of said field effect transistor through said emitter grounded transistor, and said other of said output signals being coupled to said source of said field effect transistor.

3. A variable gain amplifier device according to claim 2 wherein said other output signal is coupled to said source of said field effect transistor through an emitter follower transistor.

4. A variable gain amplifier device according to claim 1 wherein said transistor of said supply means produces said two output signals at the collector and emitter electrodes, respectively, thereof.

5. A variable gain amplifier device according to claim 1 wherein said signals are substantially the same level but opposite polarity are capacitively coupled to said source and drain of said field effect transistor.

6. A variable gain amplifier device according to claim 1 wherein said constant current circuit comprises a transistor, the collector of which is coupled to the emitter of said emitter grounded transistor, and the emitter of which is coupled to ground.

* * * * *